United States Patent [19]

Ishijima

[11] Patent Number: 5,136,588
[45] Date of Patent: Aug. 4, 1992

[54] INTERLEAVING METHOD AND APPARATUS

[75] Inventor: Tomoharu Ishijima, Tokyo, Japan

[73] Assignee: Kabushiki Kaisha CSK, Tokyo, Japan

[21] Appl. No.: 436,470

[22] Filed: Nov. 14, 1989

[51] Int. Cl.[5] .......................................... H03M 13/22
[52] U.S. Cl. ...................................... 371/2.1; 365/239; 377/26; 377/44
[58] Field of Search .................... 371/2.1, 2.2, 39.1, 371/45; 341/81; 377/44, 26; 365/239, 240

[56] References Cited

U.S. PATENT DOCUMENTS 4,312,070  1/1982  Coombes et al. ................. 371/39.1
4,559,625  12/1985  Berlekamp et al. ................ 371/2.1

OTHER PUBLICATIONS

Millman, J. et al., *Microelectronics*, McGraw-Hill, 1987, 333–334.

Zaks, R. et al., *From Chips to Systems*, Sybex, 1987, pp. 79–103.

*Primary Examiner*—Stephen M. Baker

[57] ABSTRACT

An interleaving method and apparatus suitable for burst error correction occurring in data transmission or reading of recording medium. In the interleaving method in which data to be transmitted is once written in a storing means and then read to be output in order different from a writing order, a plurality of counters for dividingly generating addresses of the storing means is used; and an operational relationship between the counters is changed between writing and reading of the storing means. ROMs for address translation can be omitted so that the number of gates is reduced very much. Thus, a reasonable interleaving apparatus suitable for LSI formation can be realized. In addition, since ROMs for address translation interposed between the counter and the storing means in the conventional apparatus are omitted, access time for the storing means can be shortened substantially.

4 Claims, 8 Drawing Sheets

Fig. 3A

| TIME | COUNT VALUE | | WRITING ADDRESS | WRITING DATA |
| --- | --- | --- | --- | --- |
| | C2 | C1 | | |
| t0 | 0 | 0 | 0 | A |
| t1 | 0 | 1 | 1 | B |
| t2 | 0 | 2 | 2 | C |
| t3 | 0 | 3 | 3 | D |
| t4 | 1 | 0 | 4 | E |
| t5 | 1 | 1 | 5 | F |
| t6 | 1 | 2 | 6 | G |
| t7 | 1 | 3 | 7 | H |
| t8 | 2 | 0 | 8 | I |
| t9 | 2 | 1 | 9 | J |
| t10 | 2 | 2 | 10 | K |
| t11 | 2 | 3 | 11 | L |

Fig. 3B

| TIME | COUNT VALUE | | READING ADDRESS | READING DATA |
| --- | --- | --- | --- | --- |
| | C2 | C1 | | |
| t0 | 0 | 0 | 0 | A |
| t1 | 1 | 0 | 4 | E |
| t2 | 2 | 0 | 8 | I |
| t3 | 0 | 1 | 1 | B |
| t4 | 1 | 1 | 5 | F |
| t5 | 2 | 1 | 9 | J |
| t6 | 0 | 2 | 2 | C |
| t7 | 1 | 2 | 6 | G |
| t8 | 2 | 2 | 10 | K |
| t9 | 0 | 3 | 3 | D |
| t10 | 1 | 3 | 7 | H |
| t11 | 2 | 3 | 11 | L |

Fig. 8A

| TIME | COUNT VALUE | | WRITING ADDRESS | WRITING DATA |
|---|---|---|---|---|
| | C2 | C1 | | |
| $t_0$ | 2 | 3 | 11 | A |
| $t_1$ | 2 | 2 | 10 | B |
| $t_2$ | 2 | 1 | 9 | C |
| $t_3$ | 2 | 0 | 8 | D |
| $t_4$ | 1 | 3 | 7 | E |
| $t_5$ | 1 | 2 | 6 | F |
| $t_6$ | 1 | 1 | 5 | G |
| $t_7$ | 1 | 0 | 4 | H |
| $t_8$ | 0 | 3 | 3 | I |
| $t_9$ | 0 | 2 | 2 | J |
| $t_{10}$ | 0 | 1 | 1 | K |
| $t_{11}$ | 0 | 0 | 0 | L |

Fig. 8B

| TIME | COUNT VALUE | | READING ADDRESS | READING DATA |
|---|---|---|---|---|
| | C2 | C1 | | |
| $t_0$ | 2 | 3 | 11 | A |
| $t_1$ | 1 | 3 | 7 | E |
| $t_2$ | 0 | 3 | 3 | I |
| $t_3$ | 2 | 2 | 10 | B |
| $t_4$ | 1 | 2 | 6 | F |
| $t_5$ | 0 | 2 | 2 | J |
| $t_6$ | 2 | 1 | 9 | C |
| $t_7$ | 1 | 1 | 5 | G |
| $t_8$ | 0 | 1 | 1 | K |
| $t_9$ | 2 | 0 | 8 | D |
| $t_{10}$ | 1 | 0 | 4 | H |
| $t_{11}$ | 0 | 0 | 0 | L |

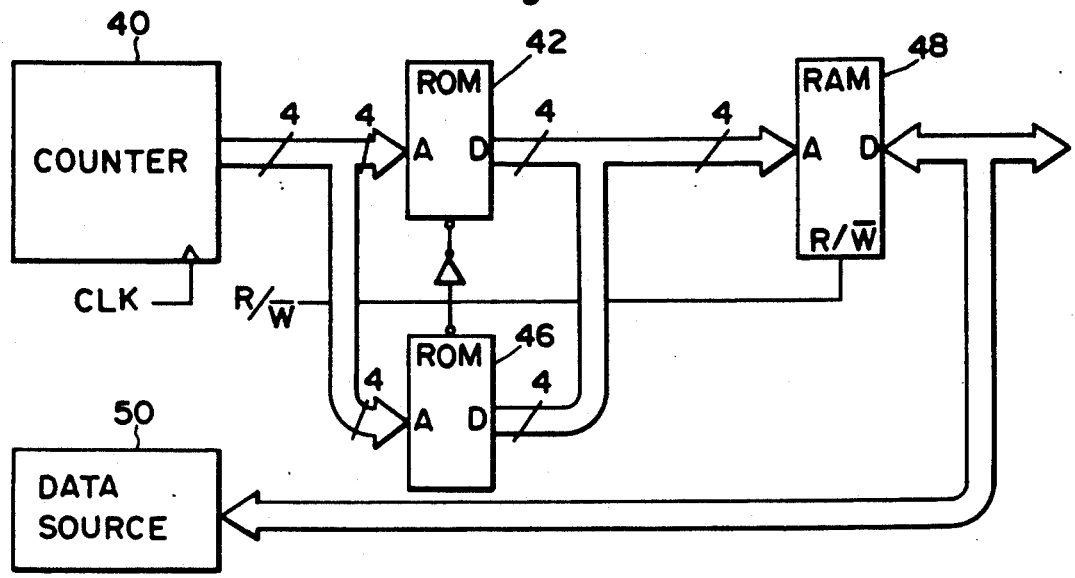

Fig. 11 (PRIOR ART)

|  | $t_0$ | $t_1$ | $t_2$ | $t_3$ | $t_4$ | $t_5$ | $t_6$ | $t_7$ | $t_8$ | $t_9$ | $t_{10}$ | $t_{11}$ |
|---|---|---|---|---|---|---|---|---|---|---|---|---|
| WRITING | A | B | C | D | E | F | G | H | I | J | K | L |
| READING | A | E | I | B | F | J | C | G | K | D | H | L |

Fig. 12 (PRIOR ART)

| A | B | C | D |
|---|---|---|---|
| E | F | G | H |
| I | J | K | L |

INTERLEAVING METHOD AND APPARATUS

TECHNICAL FIELD

This invention relates to an interleaving method and apparatus suitable for correction of, so-called burst error which might occur during data transmission or reading of the recording medium.

BACKGROUND OF THE INVENTION

Errors massedly generated in the form of burst during data transmission by a transmission system or reading of data on an optical recording medium have been known as a burst error. For example, data is recorded at a high density within a limited space of a recording medium in the optical recording medium, so that even a small flow would result in a number of defect bits.

In general, as an error correcting code for correcting an error, there has been widely used BCH code (Bose-Chaudhuri-Hocquenghem code) including Reed-Solomon Code.

Even when the error lasts too long to be correctable by such as error correcting code, an interleaving method may be used. According to this method, recorded data or transmission data is broken up according to a certain rule, so that when the data is restored, the burst error is dispersed into various portions and errors in the respective portions are correctable by the error correcting code.

FIG. 9 illustrates a block diagram of a conventional interleaving apparatus. For convenience, 3×4 interleaving for each 12 data is illustrated for an example. A basic method for interleaving is such that: when data from a data source 50 is transmitted or recorded on a recording medium, data output from the data source 50 is sequentially written once into a read/write memory (RAM) 48 and the data is read in an address sequence different from an address sequence when the data is written, to interleave the data.

In the conventional apparatus of FIG. 9, a counter 40 is used for generating an address and read-only-memories (ROM) 42 and 46 are used for changing the output data from the counter between reading and writing. Numerals shown in FIGS. 10A and 10B, for example, are written in ROMs 42 and 46.

A brief description of an operation of the conventional apparatus will be now given.

If data A, B, C, D, E, F . . . is output from the data source 50 as illustrated in an upper row of FIG. 11, the data is once written in RAM 48. In the writing, a reading/writing switching signal R/W (hereinafter referred to simply as signal RW) becomes "low" and ROM 46 is inabled, while ROM 42 is disabled through an inverter 44.

Since data same as the addresses of ROM 46 are written in ROM 46 (in this case, ROM 46 functions just as a buffer), the addreses of RAM 48 are addressed in an ascending order if the counter 40 is an up-counter and written in as illustrated in FIG. 10C.

When RAM 48 is read, RW signal becomes "high" and ROM is enabled, while ROM 46 is desabled. Therefore, the output data from the counter 40 is translated by ROM 42. More particularly, the addresses of RAM 48 are addressed in order of 0, 4, 8, 1, 5... as illustrated in FIG. 10A. As a result of this, the data is read from RAM 48 in a sequence different from the writing sequence as illustrated in a lower row of FIG. 11.

The processing operation as described above is equivalent to an operation reading, sequentially in a column direction, a matrix of 3×4 of FIG. 12, in which serial data is sequentially arranged in a row direction.

A receiving unit for transmitted data or a reproducing unit for a recording medium comprises an apparatus as shown in FIG. 9 which restors the serial data into an original order by carrying our a procedure reverse to the write/read procedure as described above. More particularly, the data is once written in RAM 48 according to the output from ROM 42 and it is thereafter read according to the output from ROM 46.

Since ROMs are used in the conventional apparatus as described above, a considerably large number of gates are needed. This is a problem to form the circuit of the apparatus in LSI. Further, since address signals from the counter for addressing a storing means are translated by ROM, an accessing time of RAM is substantially increased, preventing speed-up of an interleaving operation.

DISCLOSURE OF INVENTION

Therefore, it is an object of the present invention to provide an interleaving method and apparatus which is suitable to be formed in LSI and capable of accessing a storing means directly by an address signal from a counter.

The present invention provides, to solve the problems as described above, the following two inventions.

A first invention features an interleaving method in which data to be transmitted is once written in a storing means and then read to be output in order different from a writing order, which method is characterized in that a plurality of counters for dividingly generating addresses of the storing means is used; and an operational relationship between the counters is changed between writing and reading of the storing means.

A second invention features an interleaving apparatus in which data to be transmitted in once written in a storing means and then read to be output in order different from a writing order as illustrated in FIG. 1, which apparatus comprises:

a plurality of counters C1 and C2 each having a data output terminal connected to a part of address input terminals of the storing means; and a counter control means 2 which receives a clock signal and a write/read switching signal for the storing means to switch the operational relationship between the respective counters by the write/read switching signal.

In the second invention, two counters are preferably used and a sum of output bits of the counters is an address of the storing means.

Or, the counter control means preferably comprises AND gates, an inverter and OR gates.

If output bit numbers of the counters C1 and C2 are n and m, respectively, (n+m) bits are used as addresses for (n+m) bits of the storing means.

The data to be written once into the storing means may be one bit or plural bits.

The description "operational relationship" as given above means a relationship in which one of the counters is clock driven per cycle of another counter and the description "the operational relationship is changed" means the relationship in which a certain counter is clock driven per cycle of another counter is changed.

One cycle of the counter means all N values of a divided-by-N counter are counted, but the order may be ascending or descending.

The clock to be input into the counter is not always of a fixed period.

According to the present invention, addresses of the storing means are dividedly generated by a plurality of counters and the operational relationship between the respective counters is changed between the writing and reading of the storing means, so that the storing means can be accessed directly by address signals from the counters and the conventional ROM of address translation interposed between the counter and the storing means can be omitted. Therefore, the gate number can be reduced very much and the access time for the storing means can be shortened very much.

Furthermore, various interleaving modes can be attained by selecting the number of the counters used and/or switching up/down-counting in write/read operation. This also enables relatively complicated data enciphering. More particularly, since original data can not be restored on a data receiving (reproducing) side unless a method or apparatus corresponding to the method and configuration of the interleaving on a data transmitting (recording) side, the enciphering effect can be increased as the interleaving becomes more complicated.

BRIEF DESCRIPTION OF DRAWINGS

FIG. 3A and FIG. 3B are state tables showing an operation of the circuit shown in FIG. 2;

FIG. 8A and FIG. 8B are state tables of an operation of the circuit shown in FIG. 7;

FIG. 9 is a block diagram showing a configuration of a conventional interleaving apparatus;

FIG. 10A, FIG. 10B, FIG. 10C, FIG. 11 and FIG. 12 are explanatory views for explanation of the apparatus shown in FIG. 9.

BEST MODE FOR CARRYING OUT INVENTION

Embodiment of the present invention will now be described. Although the following description refers to an example wherein 3×4 interleaving is carried out, a larger matrix may be used.

Configuration of First Embodiment

Figure 1:
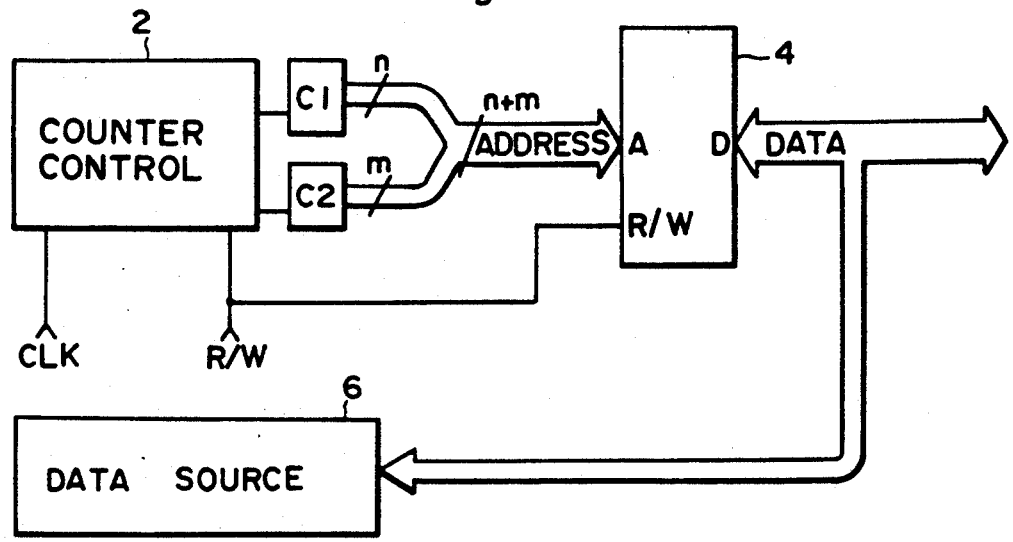
FIG. 1 is a block diagram showing a structure of the present invention.
Figure 2:
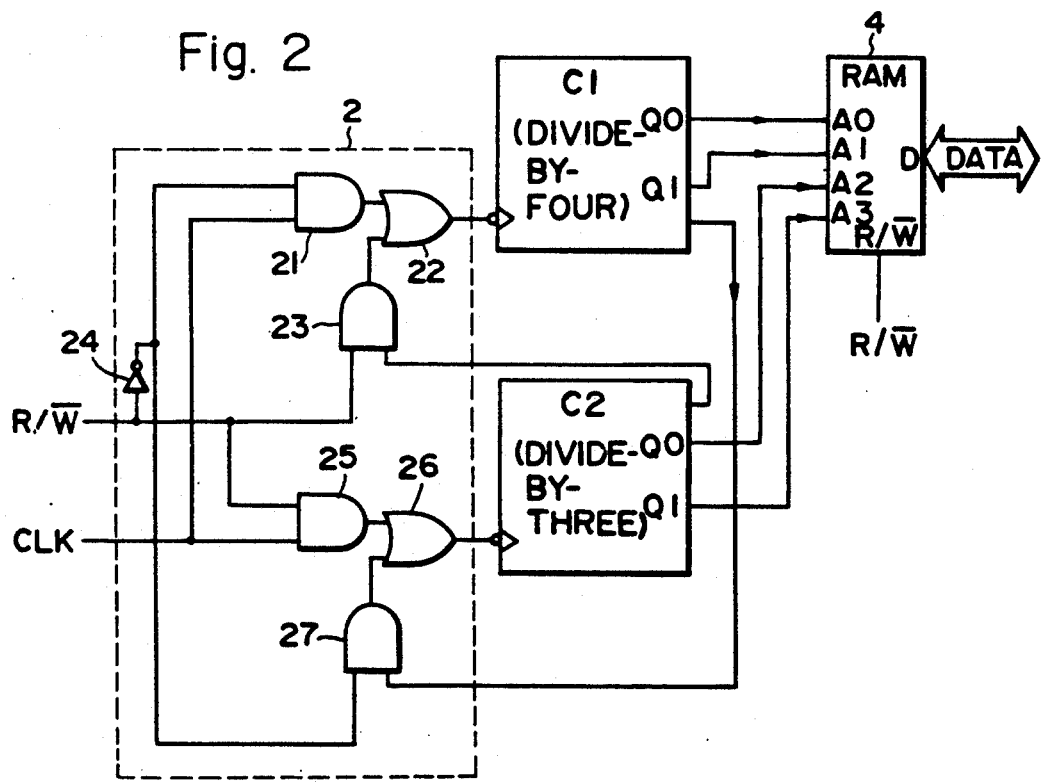
FIG. 2 is a circuit diagram of a first embodiment of the present invention.

FIG. 2 is a circuit diagram of an one form of an interleaving apparatus according to one embodiment of the present invention.

In this embodiment, counters C1 and C2 are a divide-by-four counter and a divide-by-three counter, respectively. A storing means comprising RAM 4 has an address of 4 bits. Output terminals Q0 and Q1 of the counter C1 are connected to address input terminals A0 and A1 of RAM 4, respectively. Output terminals Q0 and Q1 of the counter C2 are connected to address input terminals A2 and A3 of RAM 4, respectively. A counter control circuit 2 generates clock signals for the counters C1 and C2 in response to a clock CLK or a write/read switching signal RW. A data source 6 for generating data to be written in RAM 4 is omitted in FIG. 2.

A counter control circuit 2 comprises AND gates 21, 23, 25 and 27, an inverter 24 and OR gates 22 and 26.

The AND gate 21 receives, at one input terminal thereof, the clock CLK and receives, at another input terminal, the read/write switching signal RW through the inverter 24. The AND gate 25 receives, at its two input terminals, the clock CLK and the read/write switching signal RW. The AND gate 23 receives, at its one input terminal, the switching signal RW and receives, at another input terminal, an output from Q1 of the counter C2.

The AND gate 27 receives, at its one input terminal, the switching signal RW through the inverter 24, while it receives, at another input terminal, an output Q1 and Q2 from the counter C1. The OR gate 22 receives, at its two input terminals, outputs from the AND gates 21 and 23, respectively. The OR gate 26 receives, at its two input terminals, outputs from the AND gates 25 and 27, respectively. Outputs from the OR gates 22 and 26 are connected to clock input terminals of the counters C1 and C2, respectively.

Operation of First Embodiment

Figure 4A:
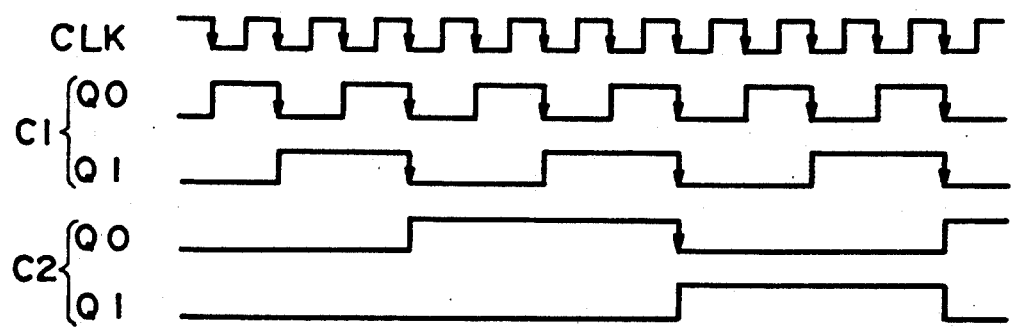
FIG. 4A and FIG. 4B are timing diagrams of a counter shown in FIG. 2.
Figure 4B:
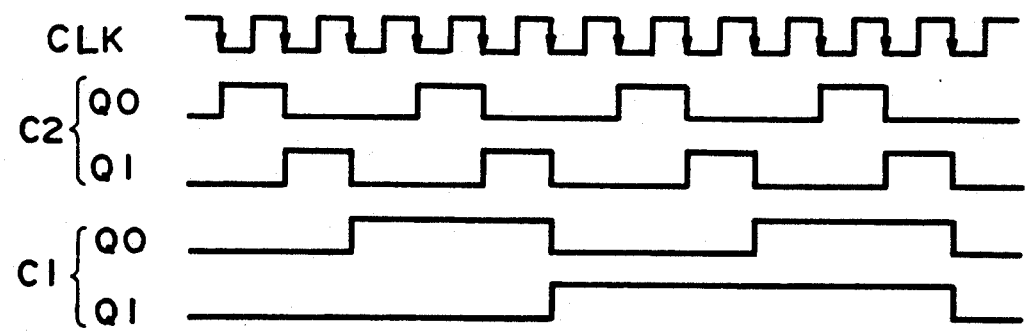

An operation of the circuit shown in FIG. 2 will now be described. FIG. 3A shows states of the counters and states of written data when RAM 4 is in an writing operation and FIG. 4A is a timing diagram of the respective counters. Similarly, FIG. 3B shows states of the counters and states of data when RAM 4 is in a read operation and FIG. 4B is a timing diagram of the respective counters.

As in the description of the conventional apparatus, the data source generates serial data A, B, C, D, E ... In writing when the switching signal RW becomes "low", the clock CLK passes through the AND gate 21 and the OR gate 22 to drive the counter C1. In this case, the counters count up by trailing ends of input clocks.

The counter C2 counts up by a trailing end of the output from Q1 of the counter C1 (i.e., carry of the counter C1). As a result of this, a write address of RAM 4 changes sequentially as 1, 2, 3, 4, 5 .... Thus, the serial data is written in order of the address.

After twelve data have been written, the switching signal RW becomes "high" and RAM 4 is put into reading state. At this time, the clock CLK is passed through AND gate 25 and the OR gate 26 to drive the counter C2.

The counter C1 counts up by a trailing end of the output from Q1 of the counter C2 (i.e., carry of the counter C2) as can be seen from FIG. 4B. As a result of this, the order of the reading address of RAM 4 changes in order (0, 4, 8, 1, 5 ... ) different from that of the writing address. Thus, the serial data is read in the order different from that in the writing operation.

These write/read operation with reference to RAM 4 is repeated until the serial data ends.

Figures 5, 6:
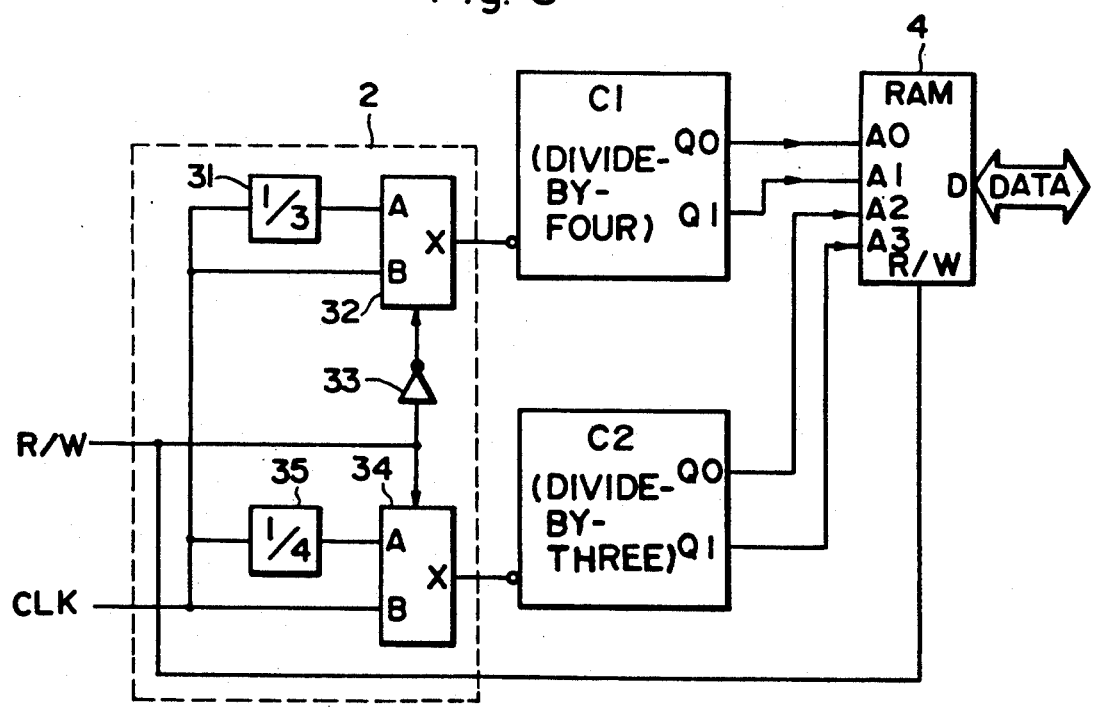
FIG. 5 is an explanatory view for explaining an operation of the circuit shown in FIG. 2.
FIG. 6 is a circuit diagram of a second embodiment of the present invention.

FIG. 5 shows the values (binary numbers) of the counters C1 and C2 and the addresses (decimal numbers) of RAM 4 in the form of matrix. The writing operation as described above corresponds to the access of the addresses which starts from the left of the uppermost row to the left of the lower row. The reading operation corresponds to the access of the addresses from the upper to the lower of the leftmost column and the upper of the next column.

In the receiving unit or the reproducing unit, write-/read operation may be carried out in a procedure reverse to that as described above to restore the serial data of the original order. To attain this, only the output from OR gate 22 of FIG. 2 may be applied to the counter C2 and the output from the OR gate 26 may be applied to the counter C1.

Although the counter as used above is an up-counter, it may alternatively be a down-counter. Further, the writing is effected in order of the addresses and reading is carried out not in order of the addresses in the embodiment as described above, but the writing may be effected not in order of addresses and the reading may be carried out in order of addresses.

Configuration of Second Embodiment

FIG. 6 is a circuit diagram of a second form of an interleaving apparatus according to the present invention. This invention is similar to the first embodiment except for the configuration of the counter control circuit 2. Only this difference will now be described.

The counter control circuit 2 of the present embodiment comprises a ¼ frequency divider 31, a ⅓ frequency divider 35, a multiplexers 32 and 34 and inverter 33.

The multiplexer 32 receives, at its A input terminal, a clock CLK through the divider 31 and directly receives the clock CLK at its B input terminal. The input A or B is selected by an inverted signal of the switching signal WR inverted by the inverter 33. The multiplexer 34 receives the clock CLK at its A input terminal through the divider 35 and directly receives the clock CLK at its B input terminal. The input A or B is selected according to the switching signal WR. The division ratios of the dividers 31 and 35 are determined according to the division numbers of the counter C2 and C1, respectively.

Operation of Second Embodiment

In the writing operation when the switching signal is "low", the multiplexer 32 and 34 select the input B and the input A, respectively. Therefore, the counter C1 is directly clock driven by the clock CLK. The counter C2 receives the clock CLK through the divider 35, so that it is clock driven once whenever the counter C1 is clock driven four times. As a result of this, the changes or of the states of the respective counters, timing thereof or the order of the writing addresses are equivalent to those of the first embodiment as shown in FIGS. 3A and 4A.

In the reading operation when the switching signal is "high", the multiplexer 32 selects the input A and the multiplexer 34 selects the input B. Therefore, the counter C2 is directly clock driven by the clock CLK, while the counter C1 receives the clock CLK through the divider 31, so that it is clock driven once whenever the counter C2 is clock driven three times. As a result of this, the changes of the states of the counters, timing and the order of the reading addresses are equivalent to those of the first embodiment as shown in FIGS. 3B and 4B.

Configuration of Third Embodiment

Figure 7:
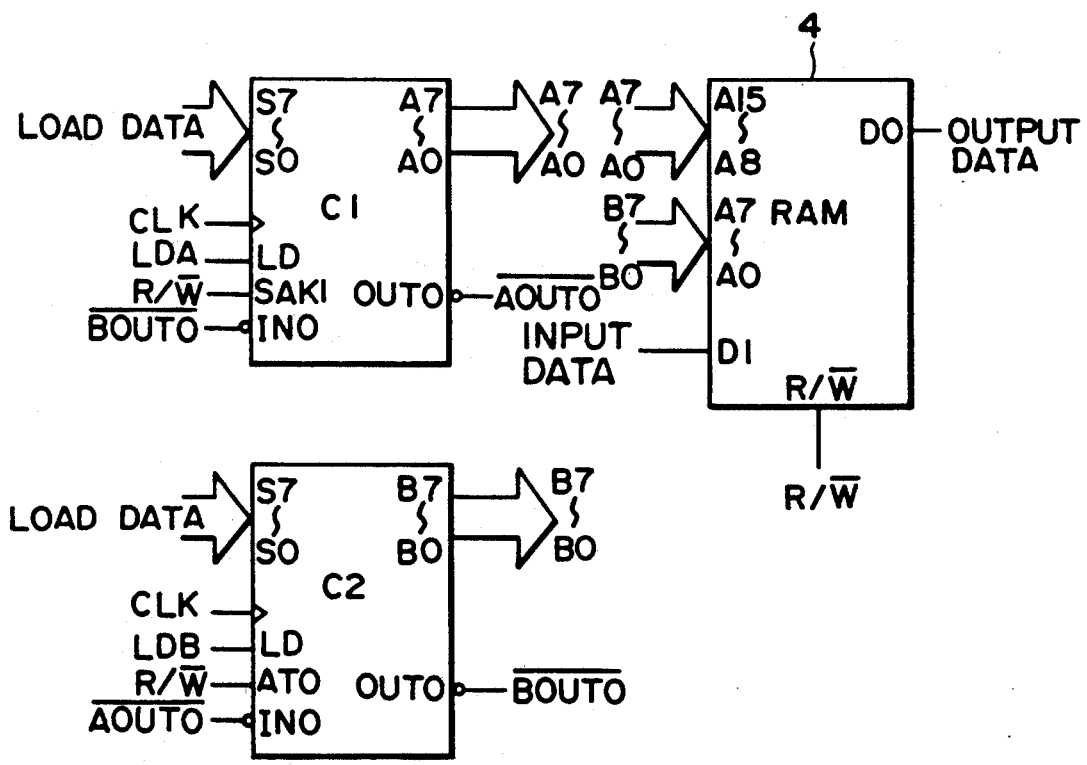
FIG. 7 is a circuit diagram of a third embodiment of the present invention.

FIG. 7 illustrates a configuration of a third form of an interleaving apparatus according to the present invention.

In this embodiment, the counters C1 and C2 are formed of programmable array logic (PAL) 20×8 manufactured by MONOLITHIC MEMORIES CO., LTD. The counter control circuits are considered to be inherent in the respective counters.

In this embodiment, the counter C1 loads data (which determines the division number of the counter) of eight bits into input terminals S0 to S7 by a rising end of the clock CLK when a signal LDA to be input to a LD terminal is output. The counter C1 counts down by the clock CLK when a siganl BOUT0 is output from an output terminal OUT0 terminal of the counter C2.

The count value is output through output terminals A0 to A7, When the count value becomes zero, a "low" signal is output through the output terminal OUT0. The down-counting is effected only by the clock CLK when the switching signal RW to be input to an input terminal SAKI is "low" and by a rising end of the clock CLK when the switching signal RW is "high" and the signal BOUT0 is "low".

Similarly, the counter C2 can load data of eight bits into input terminals S0 to S7 by a rising end of the clock CLK when a signal to be input to a LD terminal is output and counts dopwn its value only by the clock CLK or the clock ClK when a signal BOUT0 is output from an output terminal OUT0 of the counter 1. The count value is output through output terminals B0 to B7.

When the count value reaches zero, a "low" signal is output through the output terminal OUT0. The down-counting is carried out by by the clock CLK when the switching signal RW to be input to the input terminal AT0 is "high" and by a rising end of the clock CLK when the switching signal RW is "low" and the signal AOUT0 is "low".

The output data A0 to A7 and B0 to B7 are input to input terminals A8 to A15 and A0 to A7 of RAM 4, respectively. Although RAM 4 has separate input/output terminals for data in FIG. 4. RAM 4 does not necessarily have separate terminals. Further, RAM 4 shown in FIG. 4 has an input/output terminal for one-bit data, but if the data is of plural bits, a plurality of RAMs 4 may be employed or RAM for multiple-bit data.

Operation of Third Embodiment

The counters C1 and C2 are loaded with data at a timing when a clock immediately after the respective count values have become zero. To function the counters C1 and C2 as a divided-by-four counter and a divide-by-three counter, respectivel, the counter C1 is loaded with 3 (decimal number) and the counter C2 is loaded with 2 (decimal number).

Since the down-counter is used in the present embodiment, the orders of the writing addresses and the reading addresses are reverse to those in the foregoing embodiments.

According to the present embodiment, the division number of the counter can be changed easily by changing the value to be loaded to the counter. More particularly, this embodiment is flexible in that the size of the matrix as shown in FIG. 5 can be changed freely.

Modification

Both the counters C1 and C2 are up-counters or down-counters in the foregoing embodiments, but one of the counters may be an up-counter, while the other being a down-counter. Further, although the foregoing embodiments have two counters, three or more counters may be used to dividely share the addessess of RAM between them.

I claim:

1. Interleaving apparatus comprising:
   a storing means for reading and writing data bit addresses and for receiving a read/write switching signal;
   a first counter having an output in communication with an input of said storing means;
   a second counter having an output in communication with an input of said storing means;
   a control circuit arranged to receive a clock signal, the read/write switching signal and a respective output from said first and second counters, said control circuit, in response to said read/write switching signal, alternately applying the clock signal to either the input of the first counter or the input of the second counter and applying the output of the counter receiving the clock input to the input of the other counter to thereby establish a different order in the storing means for reading and writing an address.

2. Apparatus in accordance with claim 1, wherein the counters are divide by "N" counters with the value of "N" for each counter being different and defining an interleaving matrix.

3. Apparatus in accordance with claim 2, wherein the sum of the outputs of the counters is an address for storage in the storing means.

4. Apparatus in accordance with claim 1, wherein a network comprising an OR gate and two AND gates is provided for each counter in communication between the counters and the clock and read/write signals.

* * * * *